United States Patent [19]
Wei et al.

[11] Patent Number: 6,153,463
[45] Date of Patent: Nov. 28, 2000

[54] TRIPLE PLATE CAPACITOR AND METHOD FOR MANUFACTURING

[75] Inventors: Hon-Sco Wei; Yen-Tai Lin, both of Hsinchu, Taiwan

[73] Assignee: Macronix International Co., Ltd., Hsinchu, Taiwan

[21] Appl. No.: 09/350,478

[22] Filed: Jul. 9, 1999

[51] Int. Cl.[7] .............................................. H01L 21/8242
[52] U.S. Cl. ...................... 438/253; 438/396; 438/201; 438/211; 257/295; 257/296
[58] Field of Search .................... 438/201, 211, 438/253, 254, 257, 387, 396, 593; 257/68, 71, 296, 261, 295, 313, 314, 315, 316, 317, 318, 322, 324, 339, 334, FOR 532–534; 365/185.01, 185.26, 183; 361/15–17, 764, 766

[56] References Cited

U.S. PATENT DOCUMENTS

| | | | |
|---|---|---|---|
| 3,704,384 | 11/1972 | DeSimone et al. | 327/581 |
| 3,893,151 | 7/1975 | Bosselaar et al. | 257/318 |
| 4,213,139 | 7/1980 | Rao | 257/366 |
| 4,698,787 | 10/1987 | Mukherjee et al. | 365/185 |
| 4,786,828 | 11/1988 | Hoffman | 327/566 |
| 4,852,062 | 7/1989 | Baker et al. | 365/185 |
| 4,875,083 | 10/1989 | Palmour | 257/77 |
| 5,005,102 | 4/1991 | Larson | 361/313 |
| 5,172,196 | 12/1992 | Matsukawa et al. | 257/316 |
| 5,386,151 | 1/1995 | Folmsbee | 327/536 |
| 5,399,891 | 3/1995 | Yiu et al. | 257/316 |
| 5,453,391 | 9/1995 | Yiu et al. | 438/263 |
| 5,619,052 | 4/1997 | Chang et al. | 257/321 |
| 5,633,185 | 5/1997 | Yiu et al. | 438/258 |
| 5,661,056 | 8/1997 | Takeuchi | 438/261 |
| 5,750,419 | 5/1998 | Zafar | 438/3 |
| 5,763,309 | 6/1998 | Chang | 438/262 |
| 5,812,442 | 9/1998 | Yoo | 365/145 |
| 5,814,854 | 9/1998 | Liu et al. | 257/315 |
| 5,883,423 | 3/1999 | Patwa et al. | 257/532 |
| 5,932,905 | 4/2000 | O'Bryan, Jr. et al. | 257/298 |
| 6,046,490 | 4/2000 | Arita et al. | 257/535 |

OTHER PUBLICATIONS

Sharma, Ashok K., Semiconductor Memories: Technology, Testing, and Reliability, IEEE Press, 1997, pp. 50–58.

Wegener, H.A.R. and Owen, W., *Nonvolatile Semiconductor Memory Technology*, Brown/Brewer, 1977, pp. 156–158.

*Primary Examiner*—Donald L. Monin, Jr.
*Assistant Examiner*—Hoai Pham
*Attorney, Agent, or Firm*—Ernest J. Beffel, Jr.; Haynes & Beffel LLP

[57] ABSTRACT

A novel capacitor design and construction method that uses a stacked structure which is sometimes otherwise used for a so-called floating gate transistor. A first electrical contact is electrically coupled with a conductive region formed in the substrate and with a control gate layer. A second electrical contact is electrically coupled with a floating gate layer, forming a plate between the substrate and control gate layers. The footprint of this capacitor is reduced by using both sides of the floating gate layer as capacitive plate. Parasitic capacitance is relatively reduced. One or more dielectric layers can be formed for both capacitors and for floating gate transistors on the substrate in the same process step or steps.

22 Claims, 6 Drawing Sheets

TRIPLE PLATE CAPACITOR AND METHOD FOR MANUFACTURING

BACKGROUND OF THE INVENTION

1. Field of the Invention

The present invention relates to a capacitor configuration in an integrated circuit ("IC"), and more particularly, to a configuration adapted to being manufactured using many of the same process steps as in the manufacture of floating gate transistors.

2. Description of Related Art

Capacitors are found in memory circuits and other large scale integrated circuits. Capacitors hold a charge, due to the presence of dielectric material between layers of conductive material. Capacitors have been formed in integrated circuits on substrate in various configurations, including so-called MOS-capacitors and well-capacitors.

The cost of manufacturing integrated circuits depends, in part, upon the number of process steps required and upon the area of the components. Therefore, it is desirable to use the same process steps to create capacitors as are used to manufacture other IC components, such as floating gate transistors. Also, it is desirable to provide capacitors having relatively higher capacitance per unit area on the chip. The details of such process steps can be seen upon review of the following U.S. Patents which are incorporated by reference:

Yiu, et al, U.S. Pat. No. 5,399,891 issued Mar. 21, 1995;
Yiu, et al., U.S. Pat. No. 5,453,391 issued Sep. 26, 1995;
Chang, et al., U.S. Pat. No. 5,619,052 issued Apr. 8, 1997;
Yiu, et al., U.S. Pat. No. 5,633,185 issued May 27, 1997;
Takeuchi, U.S. Pat. No. 5,661,056 issued Aug. 26, 1997; and
Chang, U.S. Pat. No. 5,763,309 issued Jun. 9, 1998. A non-planer IC structure which incorporates a capacitor is described in Brown, W., Brewer, J. eds., *Nonvolatile Semiconductor Memory Technology*, published by IEEE Press 1997, Ch. 3, pp. 157–158.

Increased surface area of the conductive material on either side of a dielectric increases the available capacitance of a device. At the same time, increased surface area of horizontal capacitor plates decreases the density of devices on the IC and increases cost. This concern about the density of devices has led to trench capacitor designs. Generally, it is desirable to minimize the footprint or the surface area of horizontal capacitor plates.

Parasitic capacitance is inherent in the construction of IC devices on a substrate. In the design of a capacitor, it is desirable for the parasitic capacitance to be small in relationship to the design capacitance.

SUMMARY OF THE INVENTION

The present invention provides a novel capacitor design and construction method that uses a stacked structure sometimes otherwise used for a so-called floating gate transistor. A conductive region in a substrate and a second conductive layer function as plates of a capacitor, which are electrically coupled. A first conductive layer, which is sandwiched between the conductive region in the substrate and second conductive layer and is separated from those layers by dielectric material, functions as the opposite plate of the capacitor. This capacitor is expected to have the capacitance of two individual capacitors connected in parallel by taking advantage of the surface area on both sides of the first conductive layer.

An advantage of the present invention is that the footprint of the capacitor is reduced by electrically coupling the substrate conductive region and second conductive layer, yielding a larger plate for the same footprint than would result from a single layer horizontal plate.

A further advantage of the present invention is that its parasitic capacitance is smaller than that which would result from a single layer horizontal plate, because parasitic capacitance is related to the footprint of the conductive region in the substrate.

The present invention also facilitates the formation of an inter-gate dielectric layer across both the capacitor and floating gate transistor structures in the same process step or steps.

Other aspects and advantages of the present invention can be seen upon review of the figures, the detailed description, and the claims which follow.

DETAILED DESCRIPTION

Figure 1A:
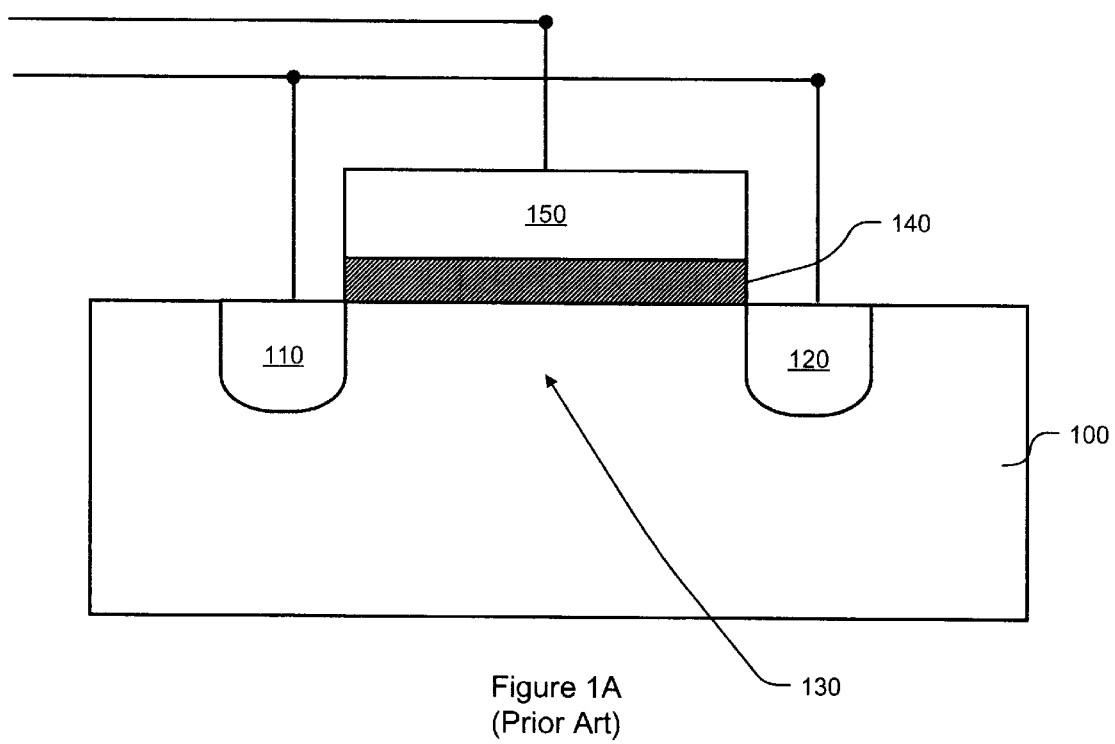
FIG. 1A is a cross-section depiction of a MOS-capacitor.
Figure 1B:
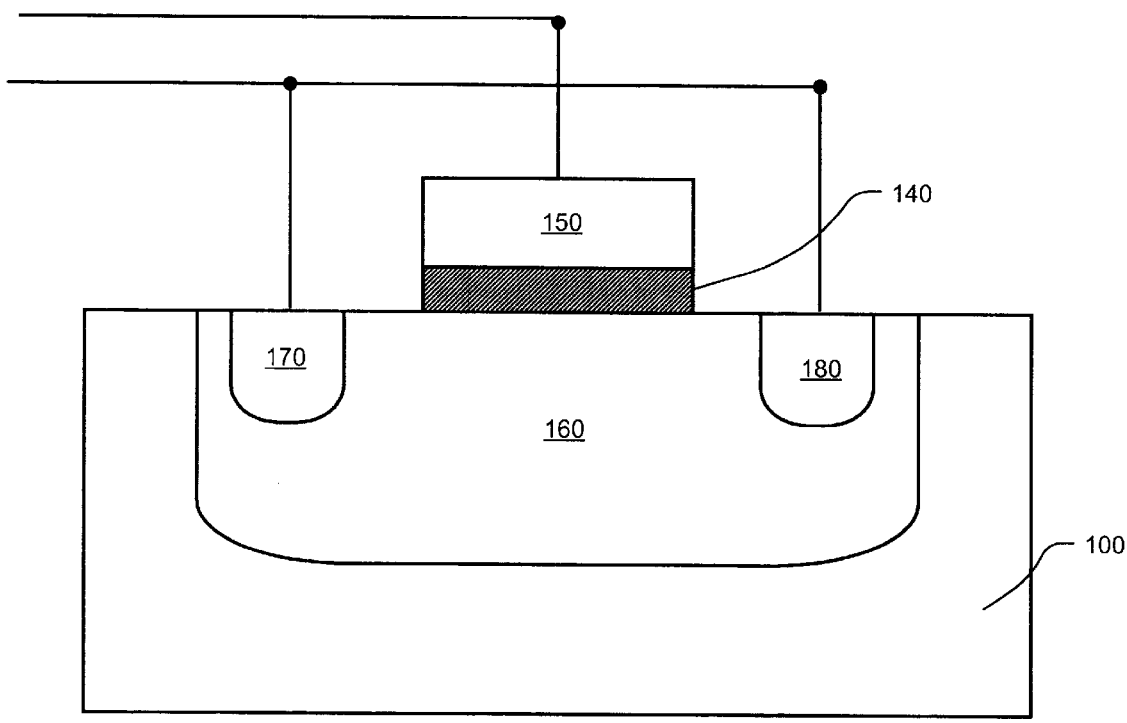
FIG. 1B is a cross-section depiction of a well-capacitor.

The preferred embodiment of the present invention can be understood by contrasting it to prior art which is illustrated in FIGS. 1A and 1B. A detailed description of the preferred embodiment is provided with reference to the figures, in which FIG. 2A illustrates a representative capacitor architecture and in which FIG. 2B illustrates the electrical characteristics of the present invention.

For context, FIG. 1A depicts a MOS-capacitor. The substrate 100 includes two diffusion regions, 110 and 120, which would act as a source and as a drain if this structure were being used as a transistor. FIG. 1A shows that the two diffusion regions are electrically coupled to function as one plate of a capacitor. The channel 130 would be controlled by the gate 150, if this structure were being used as a transistor. In a MOS-capacitor, the two diffusion regions, 110 and 120, are electrically coupled. When the gate is biased with a positive voltage relative to the source and the drain region, the channel 130 is activated interconnecting the source and the drain and providing a plate comprising the channel 130, the source 110 and the drain 120. The dielectric layer 140 is sandwiched between the gate functioning as a plate 150 and the diffusion regions functioning as a plate 110 and 120.

For further context, FIG. 1B depicts a well-capacitor. The substrate 100 contains a well 160 doped to provide a conductive region which, in turn, contains one or more contact regions such as 170 and 180. These contact regions are electrically coupled. A dielectric layer 140 sits on the well. On top of the dielectric layer is a conductive layer 150. The well and the conductive layer function as opposite plates of a capacitor.

Figure 2A:
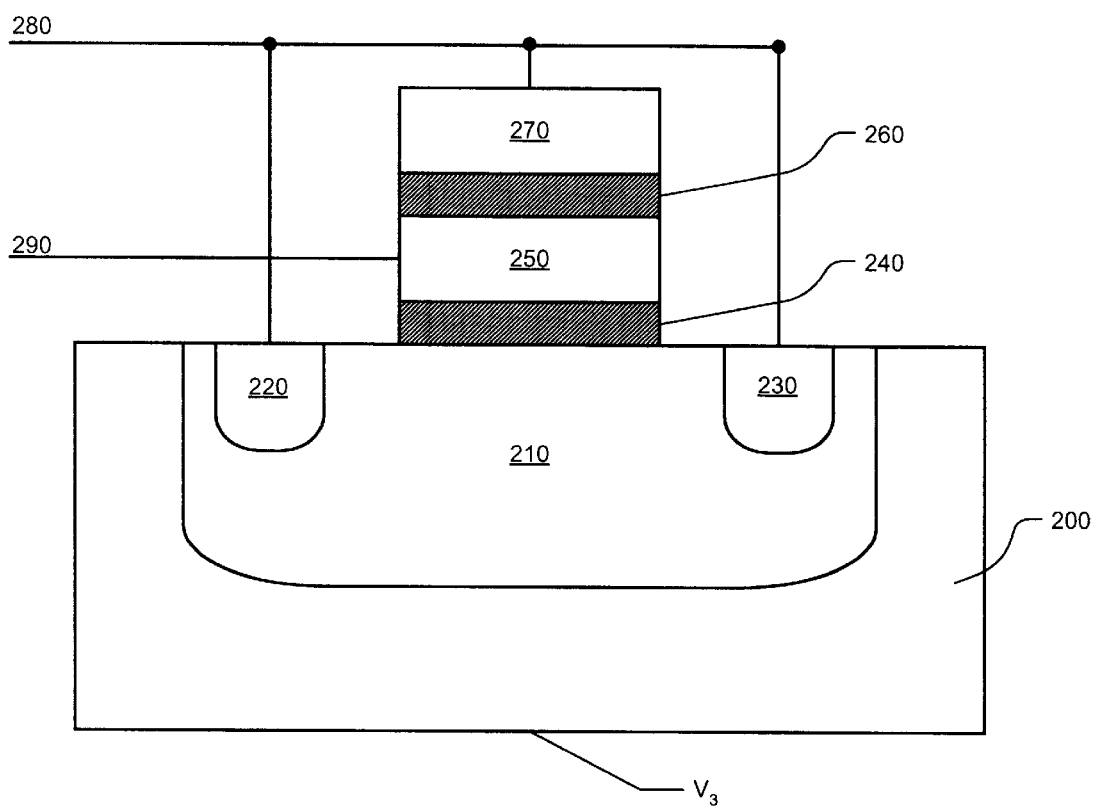
FIG. 2A is a cross-section depiction of the present invention.
Figure 2B:
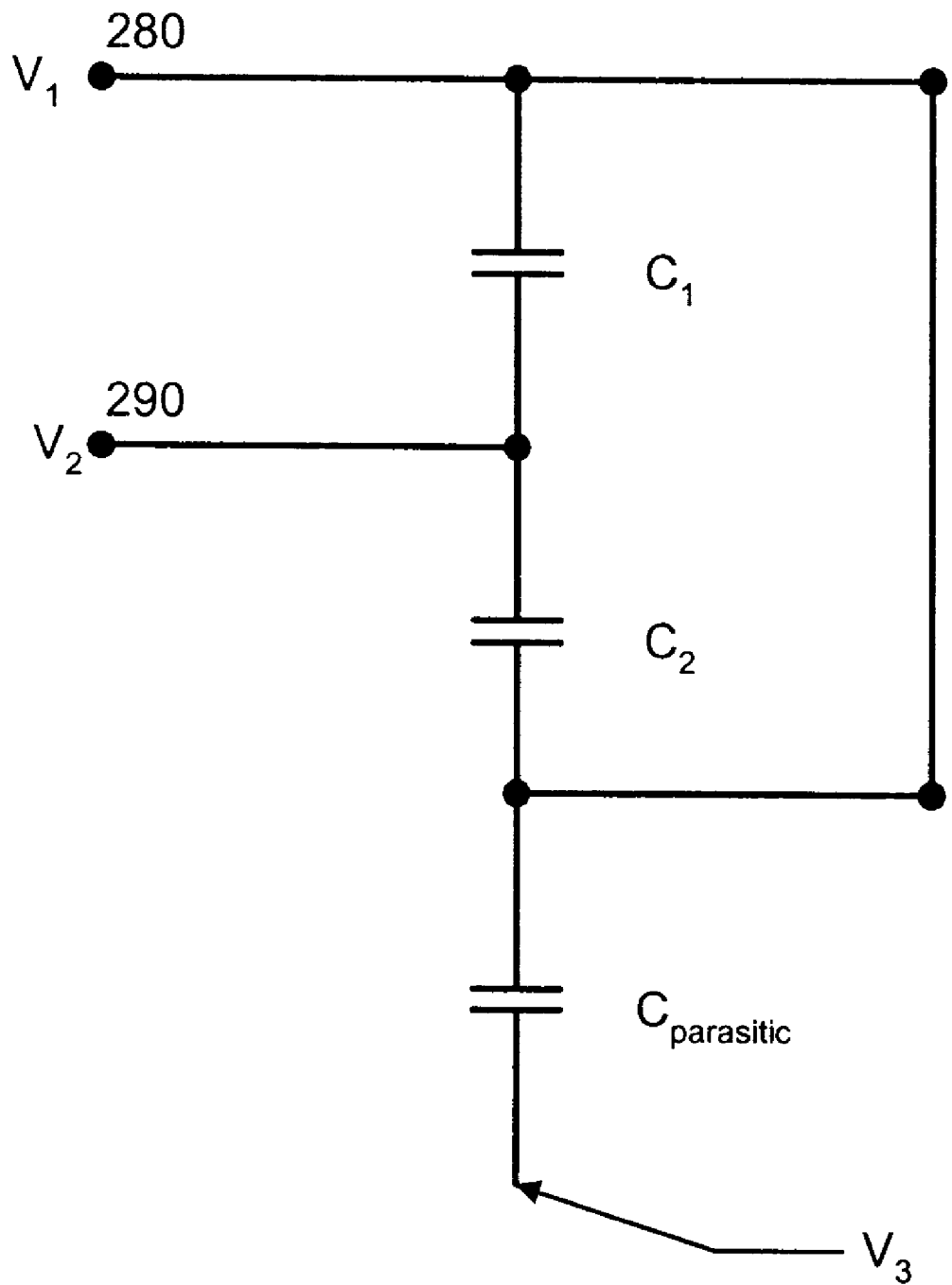
FIG. 2B is a schematic depiction of the present invention.

FIG. 2A illustrates a preferred stacked structure for the present invention. The substrate 200 contains a conductive region 210, often a well, which, itself, may contain one or more contact regions such as 220 and 230. These contact regions are electrically coupled with a first electrical contact 280. Alternatively, the conductive region in the substrate can be a channel, a source and a drain, with the source and the drain electrically coupled with the first electrical contact. Stacked on the conductive region in the substrate are a dielectric layer 240, a first conductive layer 250, a second dielectric layer 260 and a second conductive layer 270. The dielectric layers may comprise either a single substance, such as silicon dioxide or oxynitride, or may consist of composite layers such as oxide-nitride-oxide ("ONO"). The first conductive layer 250 is electrically coupled with a second electrical contact 290. The second conductive layer is electrically coupled with the first electrical contact 280 and also with the well through the contact regions. The first conductive layer functions as one plate of the capacitor and the well and the second conductive layer function as an opposite plate.

FIG. 2B illustrates schematically the capacitance of the stacked structure. Between the first and second electrical contacts 280 and 290, with voltage potentials V1 and V2, there are two dielectric layers yielding capacitances C1 and C2. In addition, the capacitance of the stacked structure is effected by parasitic capacitance $C_{parasitic}$ related to the junction between the well 210 and the substrate 200.

Figure 3A:
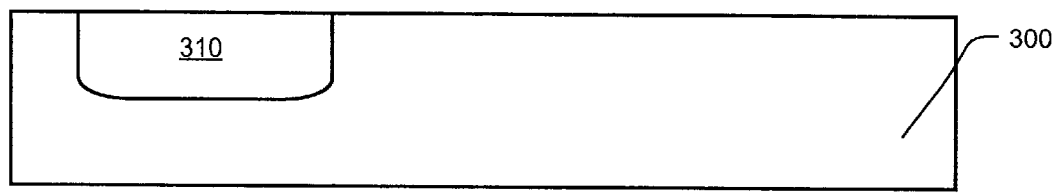
FIGS. 3A–3E illustrate a simplified version of a process for building up layers on a substrate to form a capacitor and a floating gate transistor.
Figure 3B:
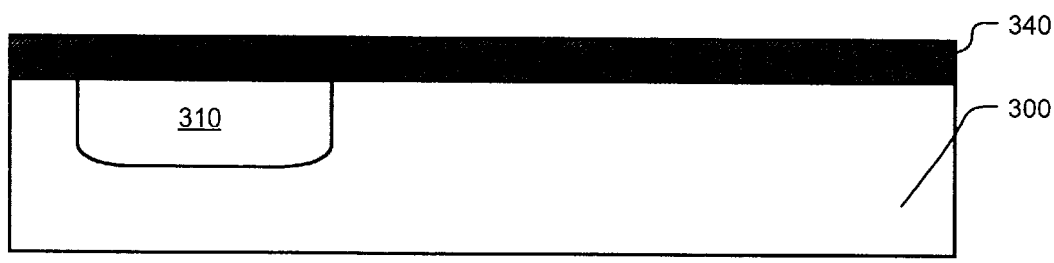
Figure 3C:
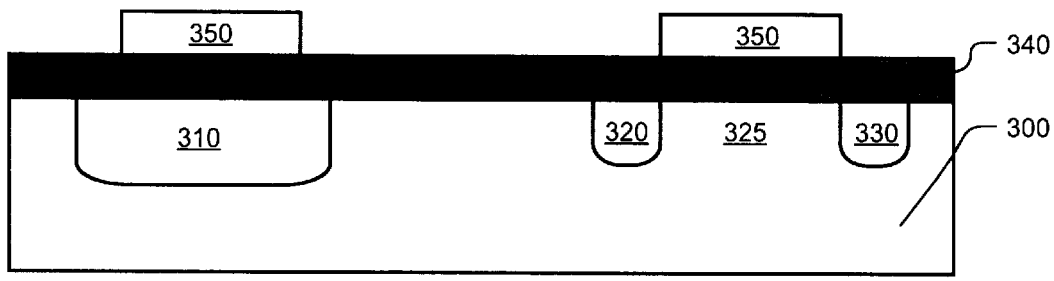
Figure 3D:
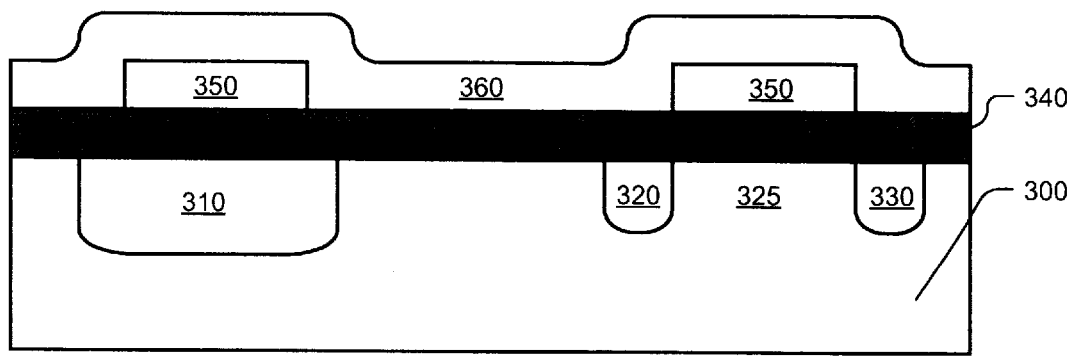
Figure 3E:
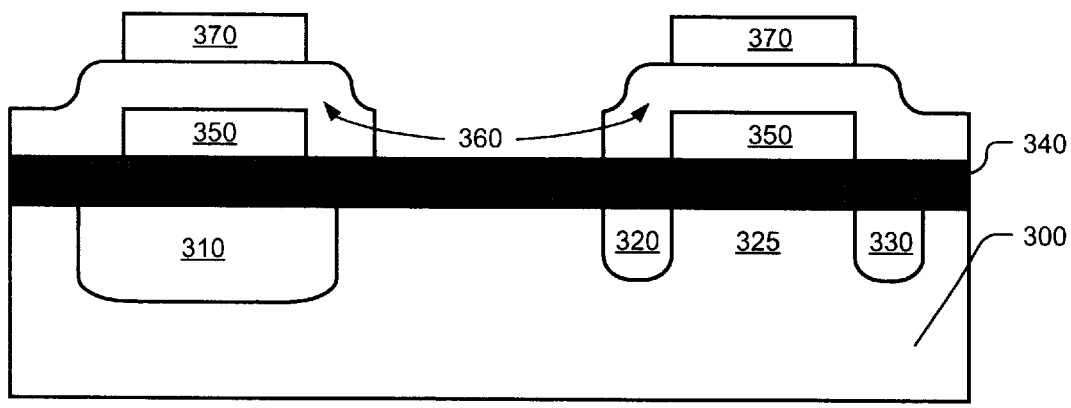

FIGS. 3A–3E illustrate one possible simplified process of constructing a capacitor and a floating gate transistor. FIG. 3A illustrates conceptually the formation in a substrate 300 of a well 310 by ion implants or by other means. Source and drain regions 320 and 330, as illustrated in FIG. 3C, could, optionally, be formed at this point in the process. Source and drain regions could be substituted for the well 310 to form a plate of a capacitor. FIG. 3B illustrates forming a gate dielectric layer 340, otherwise identified as a first dielectric layer, which may be silicon dioxide, oxynitride or other substances, optionally varying in composition across the substrate. FIG. 3C illustrates forming a first conductive layer 350. Preferably, source and drain regions 320 and 330, separated by a channel region 325, are formed after the first conductive layer is deposited, by a self-aligned process as described in U.S. Pat. No. 5,763,309, previously referenced. FIG. 3D illustrates forming an inter-gate dielectric layer 360, otherwise identified as a second dielectric layer, of a material such as ONO. The inter-gate dielectric layer comprises a single material or a composite layer. The inter-gate layer of the capacitor over well 310 and the floating gate transistor over source and drain 320 and 330 are preferably formed in the same step or steps. FIG. 3E illustrates forming a control gate conductive layer 370, otherwise identified as a second conductive layer, and the removal of a portion of the inter-gate dielectric layer 360 to separate the capacitor from the floating gate transistor. Not illustrated in these diagrams, but apparent to and understood by people of ordinary skill in the art, is the presence of a tab or projection of the first conductive layer 350 in the capacitor structure over the well 310, left exposed after other processing steps, so that an interconnect can reach the first conductive layer 350 without coupling it to the second conductive layer 370. Such a tab or projection may be orthogonal to the plane of the drawing for FIGS. 3A–3E. It also may be desirable to form at least one area of increased conductivity within the well 310, not shown in FIGS. 3A–3E, for purposes of electrically coupling it with the overlaying second conductive layer 370. Interconnects, for purposes of electrically coupling portions of the capacitor and the floating gate transistor, are not illustrated, but are understood to be part of the process of forming such devices.

Accordingly, the present invention provides a relatively small footprint for the total surface area of the well and of the second conductive layer. The parasitic capacitance effect is relatively diminished. An inter-gate dielectric layer can be shared across capacitor(s) and floating gate transistor(s) formed on the substrate.

The forgoing description of the preferred embodiment of the invention has been presented for purposes of illustration and description. The description is not intended to be exhaustive or to limit the invention to the precise form disclosed. Obviously, many modifications and variations will be apparent to practitioners skilled in this art. It is intended that the scope of the invention be defined by the following claims and their equivalents.

What is claimed is:

1. A capacitor on a substrate comprising:
   a conductive region in the substrate;
   a gate dielectric layer on said conductive region in the substrate;
   a first conductive layer on said gate dielectric layer;
   a first dielectric layer on said first conductive layer;
   a second conductive layer on said first dielectric layer;
   a first electrical contact electrically coupled with said conductive region in the substrate and said second conductive layer; and
   a second electrical contact electrically coupled with said first conductive layer.

2. A device according to claim 1, wherein the first dielectric layer comprises ONO.

3. A method of making a capacitor on a substrate comprising:
   building a stacked structure, comprising:
      a conductive region in the substrate;
      a gate dielectric layer on said conductive region in the substrate;
      a first conductive layer on said gate dielectric layer;
      a first dielectric layer on said first conductive layer; and
      a second conductive layer on said first dielectric layer;
   forming a first electrical contact electrically coupled with the conductive region in the substrate and with the second conductive layer; and
   forming a second electrical contact electrically coupled with the first conductive layer.

4. A method according to claim 3, wherein the first dielectric layer comprises ONO.

5. A process of forming a capacitor on a substrate comprising:
   forming in one or more process steps, a well, and a source and a drain separated by a channel region in the substrate;
   forming in one or more process steps, respective gate dielectric layers on the substrate over the well and over the channel region;
   forming in one or more process steps, first conductive layers on the respective gate dielectric layers;
   forming in one or more process steps, inter-gate dielectric layers on the first conductive layers;
   forming in one or more process steps, control gate conductive layers on the inter-gate dielectric layers;
   forming a first electrical contact electrically coupled with the well in the substrate and the control gate conductive layer that overlays said well; and
   forming a second electrical contact electrically coupled with the first conductive layer that overlays said well.

6. The process of claim 5, wherein the inter-gate dielectric layers overlaying the respective first conductive layers are formed by the same process steps.

7. The process of claim 5, wherein the respective first conductive layers are formed by different process steps.

8. The process of claim 6, wherein the inter-gate dielectric layers comprise ONO.

9. The process of claim 7, wherein the inter-gate dielectric layers comprise ONO.

10. The process of claim 5, wherein the source and the drain are self-aligned.

11. The process of claim 6, wherein the source and the drain are self-aligned.

12. The process of claim 6, wherein a second source and a second drain separated by a second channel region are substituted for the well.

13. The process of claim 12, wherein the first and the second source and the first and the second drain are self-aligned.

14. A process of forming a capacitor on a substrate comprising:

forming in one or more process steps, a well in the substrate;

forming in one or more process steps, respective gate dielectric layers on the substrate over the well and over a channel region;

forming in one or more process steps, first conductive layers on the respective gate dielectric layers;

forming in one or more process steps, a source and a drain separated by the channel region;

forming in one or more process steps, inter-gate dielectric layers on the first conductive layers;

forming in one or more process steps, control gate conductive layers on the inter-gate dielectric layers;

forming a first electrical contact electrically coupled with the well in the substrate and the control gate conductive layer that overlays said well; and forming a second electrical contact electrically coupled with the first conductive layer that overlays said well.

15. The process of claim 14, wherein the inter-gate dielectric layers overlaying the respective first conductive layers are formed by the same process steps.

16. The process of claim 14, wherein the respective first conductive layers are formed by different process steps.

17. The process of claim 15, wherein the inter-gate dielectric layers comprise ONO.

18. The process of claim 16, wherein the inter-gate dielectric layers comprise ONO.

19. The process of claim 15, wherein the source and the drain are self-aligned.

20. The process of claim 16, wherein the source and the drain are self-aligned.

21. The process of claim 15, wherein a second source and a second drain separated by a second channel region are substituted for the well.

22. The process of claim 21, wherein the first and the second source and the first and the second drain are self-aligned.

* * * * *